(12) United States Patent
Beintner et al.

(10) Patent No.: US 6,548,344 B1
(45) Date of Patent: Apr. 15, 2003

(54) SPACER FORMATION PROCESS USING OXIDE SHIELD

(75) Inventors: Jochen Beintner, Wappingers Falls, NY (US); Stephan Kudelka, Ottendorf-Okvilla (DE); Thomas Dyer, Pleasant Valley, NY (US)

(73) Assignees: Infineon Technologies AG, Munich (DE); International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/987,956

(22) Filed: Nov. 16, 2001

(51) Int. Cl.$^7$ .......................................... H01L 21/8242
(52) U.S. Cl. ...................... 438/241; 438/248; 438/249; 438/595
(58) Field of Search .................. 438/241, 242, 438/243, 244, 248, 249, 386, 387, 391, 595

(56) References Cited

U.S. PATENT DOCUMENTS

| | | | |
|---|---|---|---|
| 6,005,279 A | 12/1999 | Luning | 257/510 |
| 6,091,094 A * | 7/2000 | Rupp | 438/243 |
| 6,277,700 B1 | 8/2001 | Yu et al. | 438/303 |
| 6,303,452 B1 | 10/2001 | Chen et al. | 438/305 |
| 6,368,912 B1 * | 4/2002 | Chang et al. | 438/248 |

* cited by examiner

Primary Examiner—Chandra Chaudhari
(74) Attorney, Agent, or Firm—Stanton Braden

(57) ABSTRACT

In the formation of a semiconductor structure, where spacer formation is strongly dependent on the structure (e.g. taper), the improvement of a spacer formation on a poly stud planarized to pad nitride where an oxide is formed on top of the poly prior to the pad nitride strip, so that after pad nitride removal, the poly is etched back and nitride is deposited conformal followed by anisotropic nitride RIE etch, so that the oxide protects the nitride underneath from being etched.

21 Claims, 17 Drawing Sheets

SPACER FORMATION PROCESS USING OXIDE SHIELD

BACKGROUND OF THE INVENTION

1. Field of the Invention

The present invention relates to a process for formation of a spacer using an oxide shield. The spacer formation process is formed on a poly stud planarized to a pad nitride on oxide formed on top of the poly prior to the pad nitride strip. After a pad nitride removal step, the poly is etched back and nitride is deposited conformally followed by an anisotropic nitride RIE etch, so as to enable the oxide to protect the nitride underneath from being etched.

2. Description of the Prior Art

In present day requirements for ultra large scale integration (ULSI) for high density semiconductor devices, there is a requirement that the submicron features be approximately 0.25 microns and smaller in order to provide increased circuit speeds. The increased requirements for faster circuit speeds coupled with increased density also demand device features characterized by high precision and uniformity.

With this as a backdrop, it is pointed out that conventional semiconductor devices physically comprise a substrate and electrically isolated regions termed active regions, in which individual circuit components are formed. The electrical isolation of these active regions may be accomplished by thermal oxidation of the semiconductor substrate, that is, monocrystalline silicon or an epitaxial layer is formed, bound by active regions.

For example, a typical isolation region is known as a trench isolation, and in this structure, shallow trenches are etched in the substrate, and an oxide liner is thermally grown on the trench walls, whereupon the trench is refilled with an insulating material. The structure resulting is called a shallow trench isolation (STI) structure. The active region of this structure comprises source/drain regions formed in the semiconductor substrate by the implantation of impurities, spaced apart by a channel region on which a gate electrode is formed with a gate oxide layer therebetween.

The gate electrode controls the turn-on and turn-off of each transistor. After implantation of the substrate is completed, titanium silicide, CoSi or NiSi may be formed on the gates and source/drain reunions to reduce the sheet resistance in these areas to provide increased performance. The trench formation generally comprises growing a pad oxide layer on the substrate and depositing a barrier nitride layer thereon. Next, a photoresist mask is applied to delineate the trench areas. The exposed portions of the nitride layer are etched away followed by the pad oxide layer. Etching is continued into the substrate to form a shallow trench, and when the etching of the trench is completed, the photoresist is stripped off the nitride layer.

Thereafter, the substrate is oxidized to form an oxide liner on the walls and base of the trench to control the silicon-silicon dioxide interface quality, whereupon the trench is then refilled with an insulating material such as silicon dioxide and the surface is planarized by CMP and the nitride and pad oxide are stripped of the active areas to complete the trench isolation structure.

Next, well implants may be formed by and masking and ion implantation, whereupon the surface is cleaned, and a gate oxide layer is formed and a polycrystalline silicon layer is deposited and etched to form a gate electrode. Lightly-doped drain or other source/drain implants may thereafter be formed by appropriate masking and ion implantation. After the lightly-doped drain (LDD) is formed self aligned to the gate conductor, a conformal layer of oxide or nitride may be deposited and anisotropically etched to leave spacers along the edges of the gates to prevent a later applied heavy-dose source/drain implant from completely overlapping the lightly-doped area next to the gates or other shallow source/drain regions. Ion implantation may then be conducted to form source/drain regions with later activation to complete the transistor structure.

A titanium silicide, CoSi or NiSi layer may then be formed on the gates and source/drain regions by sputtering the silicide and rapid thermal annealing. If it is desirable to create unsilicided gate and source/drain regions, a resistor protective oxide is deposited prior to sputtering the silicide on the substrate and portions of the resistor protective oxide may be etched away. After the resist is etched and titanium is deposited, the oxide remaining prevents formation of silicide in the desired areas.

It is desirable when making the STI structure to have the uppermost surface of the substrate to be flush with the uppermost surface of the oxide filling the trench at the edges of the trench to maximize performance of the completed device and to obtain a flat topography for later processing steps, especially photolithographic processing to thereby facilitate formation of small features with accuracy.

During formation of the spacer, which is the result of an anisotropic etch of a material deposited conformal over a step process prior to the deposition, it has been found that the spacer formation is strongly dependent on the structure (e.g. taper) of the step.

U.S. Pat. No. 6,303,452 B1 discloses a method for making a transistor spacer etch pin point structures. The invention is incorporated into a method for forming an integrated circuit, and the integrated circuit formed thereby, by forming a gate over a portion of a substrate. A dielectric layer is formed over the gate and a portion of the substrate, and oxide sidewalls spacers are formed on the sides of the gate and on top of the dielectric layer.

A method of etching silicon nitride spacers beside a gate structure is disclosed in U.S. Pat. No. 6,277,700 B1. The process entails:

a) providing a gate electrode over a gate oxide layer on a substrate; providing a liner oxide layer over the substrate and the gate electrode; providing a silicon nitride layer over the liner oxide layer;

b) anisotropically etching the silicon nitride layer forming spacers by performing a nitride etch recipe in a plasma etcher; the nitride etch recipe comprising a main etch step and an over etch step;

(b1) the main etch step comprising the conditions: a $Cl_2$ flow between 35 and 55 molar %, a He flow between 35 and 55 molar %, and a HBr flow between 7.5 and 12.5 molar %.

A method of forming a trench edge spacer formation is disclosed in U.S. Pat. No. 6,005,279. The method comprises:

forming a trench opening and thermally growing an oxide liner on an internal surface of the trench and abutting a main surface of the substrate or epitaxial layer; filling the trench with an insulating material; depositing a protective layer having an etch rate less than the oxide liner and the insulating material on the main surface covering an exposed upper edge of the trench where the main surface abuts the liner; and anisotropically etching the protective layer to form a protective spacer on the trench edge.

There is a need in the art to improve the spacer formation on a poly stud planarized to pad nitride during formation of a semiconductor structure.

SUMMARY OF THE INVENTION

It is an object of the present invention during formation of a semiconductor structure, where spacer formation is strongly dependent on the structure (e.g. taper) to provide improved spacer formation on a poly stud planarized to pad nitride where an oxide is formed on top of the poly prior to the pad nitride strip. After pad nitride removal, the poly is etched back and nitride is deposited conformal followed by anisotropic nitride RIE etch, so that the oxide protects the nitride underneath from being etched.

DETAILED DESCRIPTION OF PREFERRED EMBODIMENT OF THE INVENTION

Figure 1:
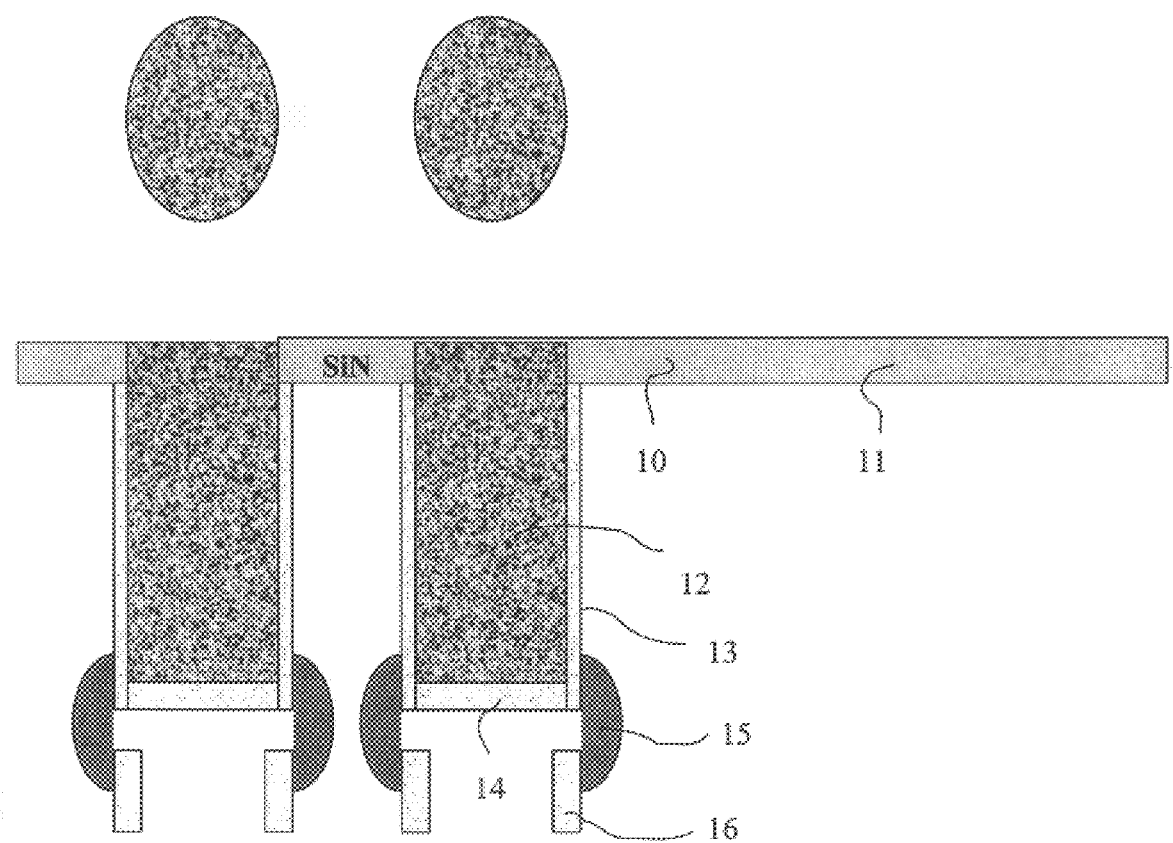
FIG. 1 depicts the semiconductor structure from which the invention process is performed; however, the detailed structure of FIG. 1 is simplified by way of FIG. 2 in order to illuminate the invention process more clearly.

The starting semiconductor structure of FIG. 1 is accomplished by:

affecting a poly recess (plasma etch, isotropic); affecting collar wet etch (buried strap divot formation) (HF etch); performing a buried strap poly divot fill using low pressure chemical vapor deposition (LPCVD); performing a buried strap poly etch back using a wet etch (i.e. $NH_4OH$); affecting oxidation of sacrificial oxide (utilizing thermal oxidation); forming a trench top oxide (TTO) deposition (using an HDP oxide); removing the TTO from the side wall (i.e. HF wet etch); affecting vertical gate oxidation (via thermal oxidation or forming a thermal oxide); affecting vertical gate poly deposition (using LPCVD poly); affecting a poly CMP down to the TTO oxide on top of the pad nitride; removing the TTO on top of the pad nitride (i.e. HF etch); and affecting a poly CMP down to the pad nitride.

As may be seen from FIG. 1, which shows a top view and cross section view of the semiconductor device structure, there is shown a pad nitride 10 and a pad oxide 11 underneath the pad nitride. The structure further comprises a vertical gate poly 12 and vertical gate oxide 13, wherein the vertical gate poly is disposed on a top trench oxide 14. In this structure, there is also shown a buried strap out diffusion 15 [source/drain] (solid state diffusion from deep trench poly obtained during oxidation of sacrificial oxide, gate oxide or any other thermal processes). An oxide collar 16 is disposed in the lower part of the structure.

Figure 2:
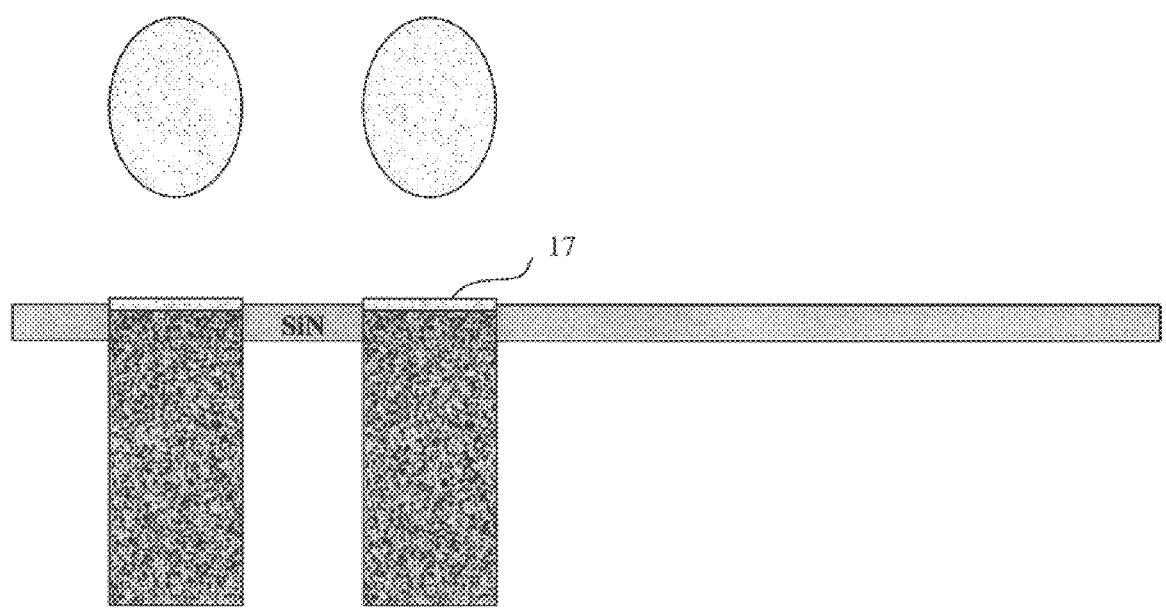
FIG. 2 shows a top view and cross sectional view of commencement of a semiconductor structure of the invention process in which there has been poly oxidation selective to a pad nitride via thermal oxidation.
Figure 3:
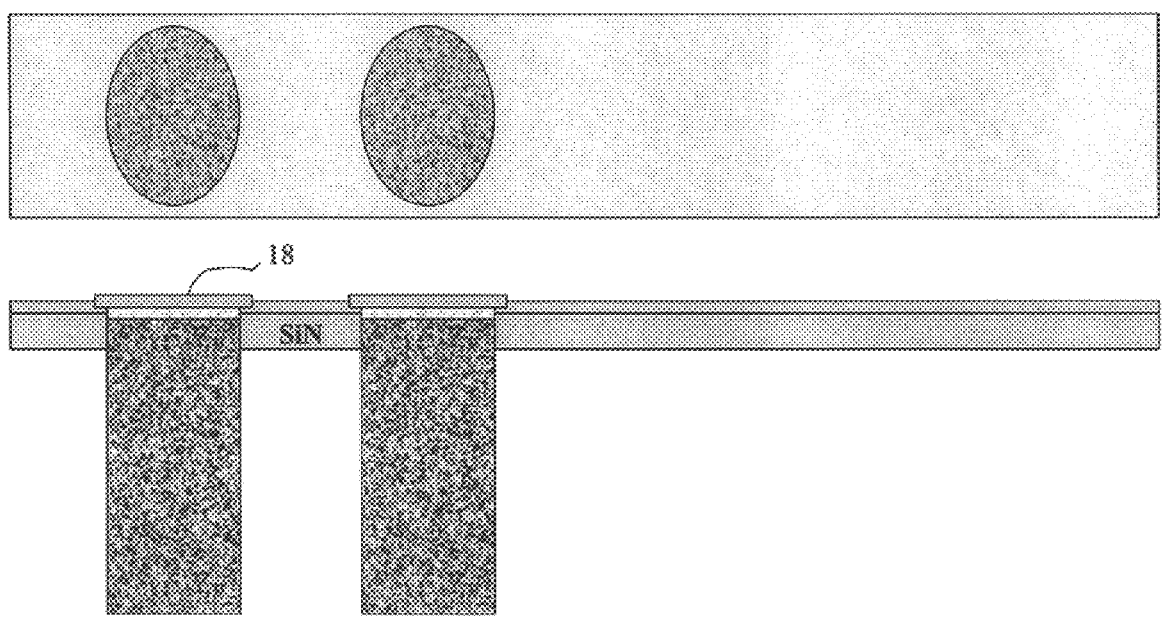
FIG. 3 shows a progression from FIG. 2 in which there is a vertical GC nitride deposition of about 55 Å by LPCVD that creates formation of a vertical GC cap nitride.

As mentioned, the detailed structure of FIG. 1 is simplified by way of FIG. 2 for purposes of illuminating commencement of the invention process. In FIG. 2, a poly oxidation that is selective to the pad nitride is affected and followed by thermal oxidation to obtain the poly oxidation 17. A vertical GC cap nitride 18 is next obtained by a vertical GC pad nitride deposition of about 55 Å, via low pressure chemical vapor deposition of the nitride.

Figure 4:
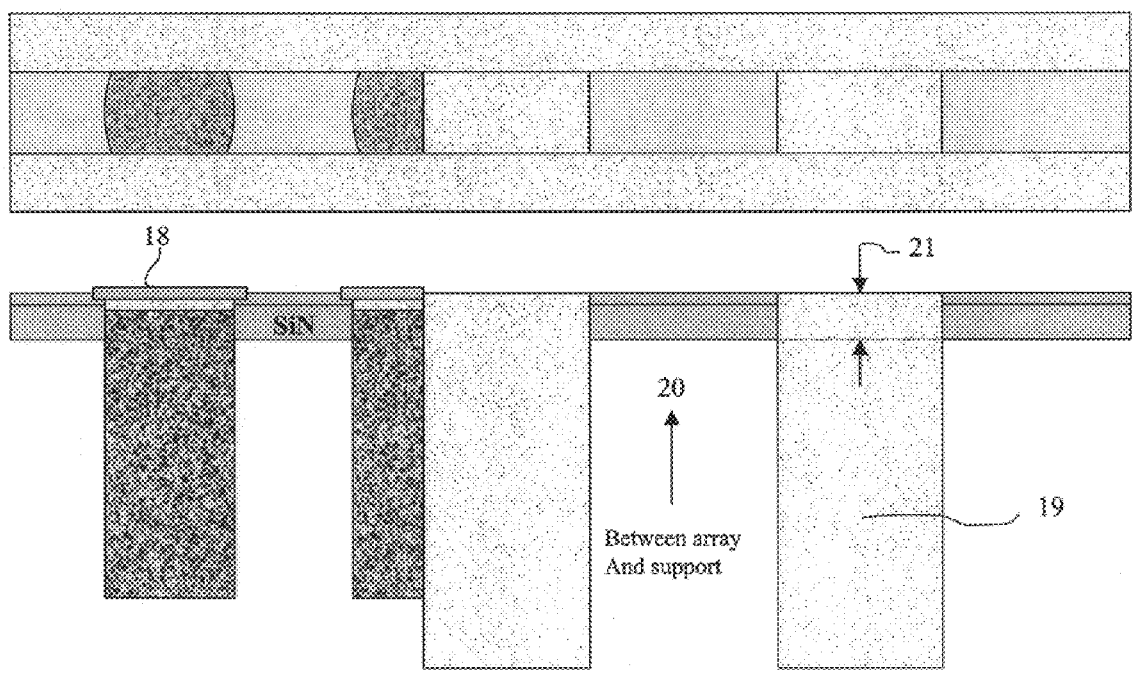
FIG. 4 shows top and cross sectional views progressing from FIG. 3 formed by affecting an isolation trench, lithography, etch isolation trench liner oxidation, HDP oxide fill and oxide planarization (CMP).

Next, as can be seen from the top and side view depictions in FIG. 4, a IT (Isolation Trench) lithography is performed followed by an etch, IT liner oxidation, an HDP oxide fill and oxide planarization (CMP) to obtain a structure which further comprises a shallow trench oxide 19 in which there is a transition area 20 between the array and support. The shallow trench isolation height 21 is approximately 600 Å.

Figure 5:
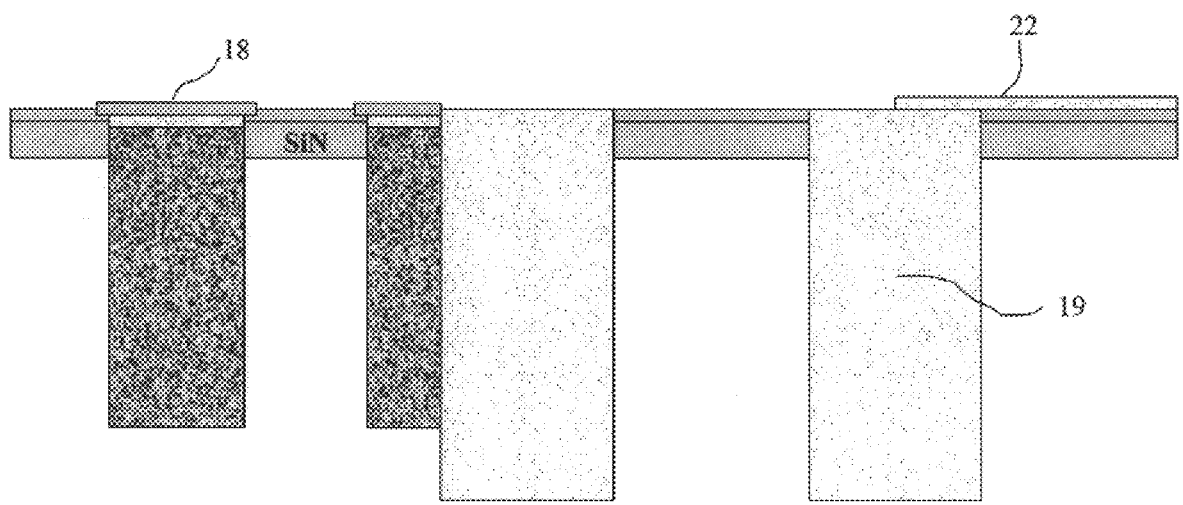
FIG. 5 is a diagram showing progression from FIG. 4, where there is deposition of a support cover oxide and structuring, by lithography and wet etch (HF).

The progression to FIG. 5 affects a support cover oxide deposition 22 of approximately 100 Å by low pressure chemical vapor deposition (LPCVD) of TEOS (Tetraethylorthosilicate) to form a silicon oxide, whereupon structuring is performed by lithography, and a wet etch (HF).

Figure 6:
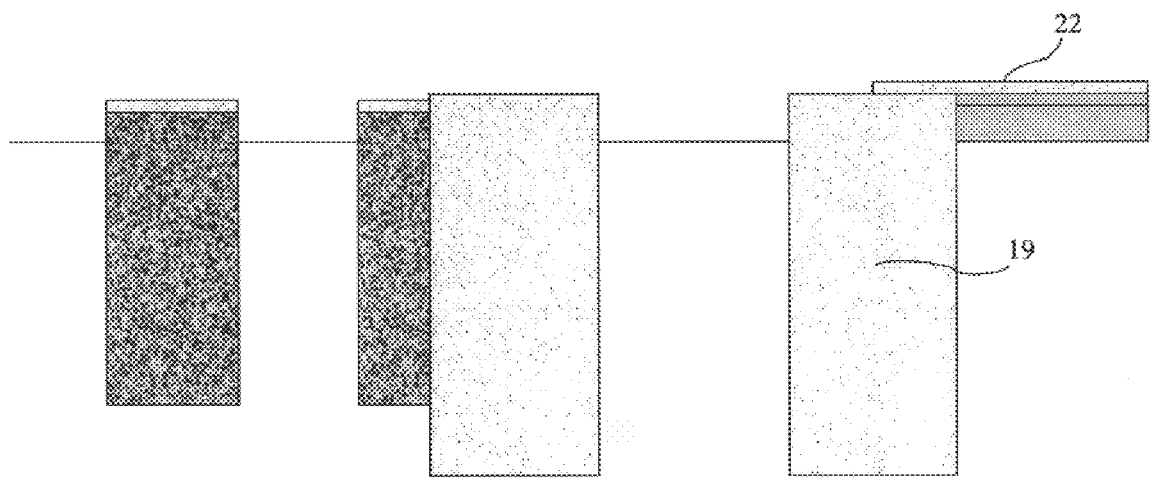
FIG. 6 is a cross sectional view of the structure of FIG. 5 following a pad nitride strip in array by hot phosphoric acid.
Figure 7:
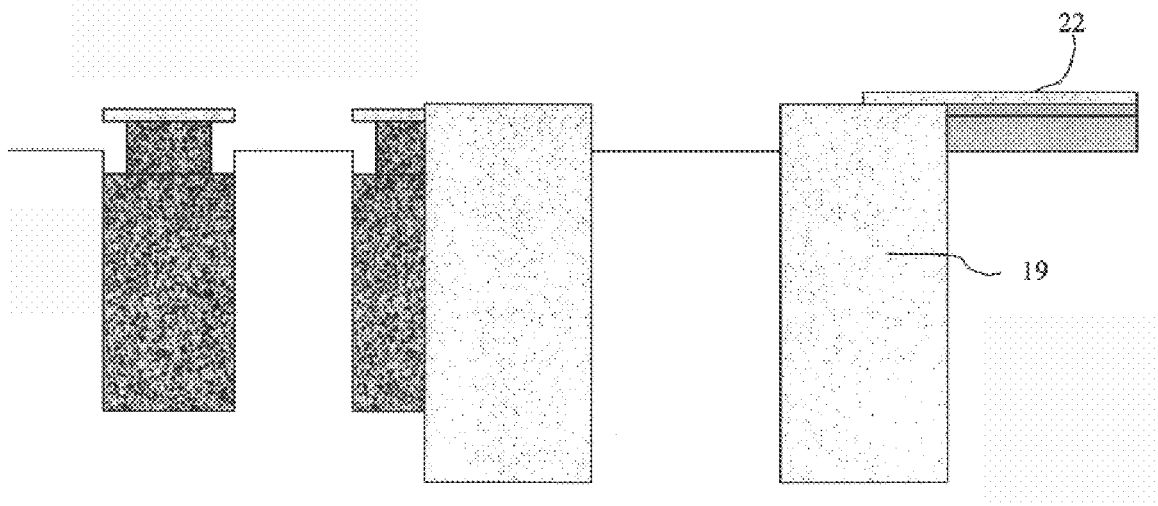
FIG. 7 is a progression from FIG. 6 in which an isotropic poly etch back (plasma etch, isotropic, selective to oxide).

A pad nitride strip in the array is affected by hot phosphoric acid to arrive at the structure shown in the cross sectional view of FIG. 6, whereupon an isotropic poly etch back (plasma etch, isotropic, selective to oxide) is affected to arrive at the structure shown in the cross sectional view of FIG. 7.

Figure 8:
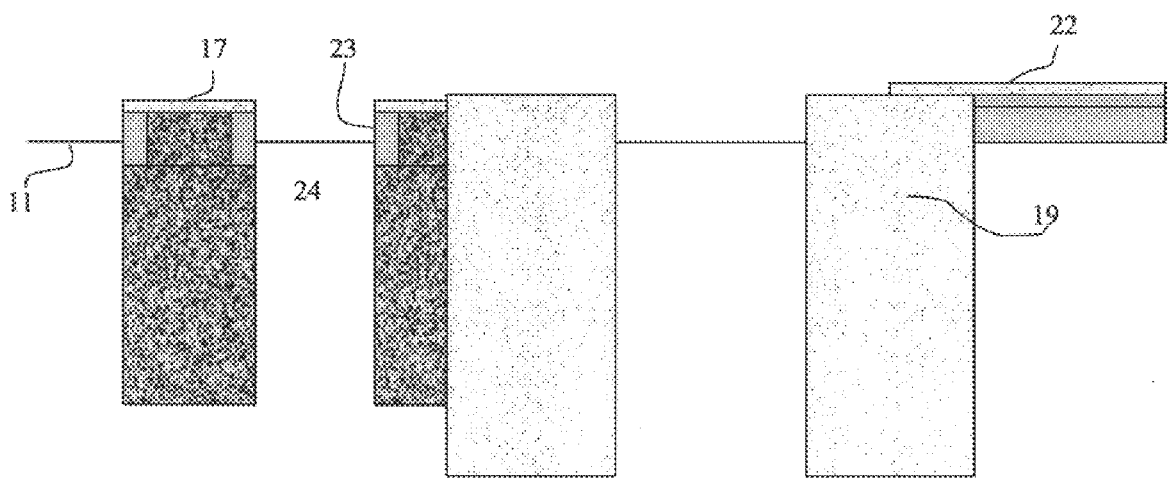
FIG. 8 is a progression from FIG. 7 in which spacer nitride deposition is made by LPCVD and spacer etch (RIE), that is selective to oxide.

Next, as can be seen in FIG. 8, a spacer nitride deposition 23 is performed using LPCVD nitride followed by a spacer etch (RIE), that is selective to the cap. In particular, spacer formation is accomplished by under etching the cap oxide followed by a conformal nitride deposition (the materials are chosen in a way that this spacer formation process can be implemented into the flow of a DRAM process with vertical array access transistor). In this connection, it is important for the spacer formation process that the material underneath the cap 17 can be etched isotropically and selective to the cap and the material covering the substrate 24, here pad oxide 11, or with or close to where the spacer is being formed. Also, the spacer material must be chosen in a way so that it can be etched (RIE) selective to the cap and the substrate covering material.

Figure 9:
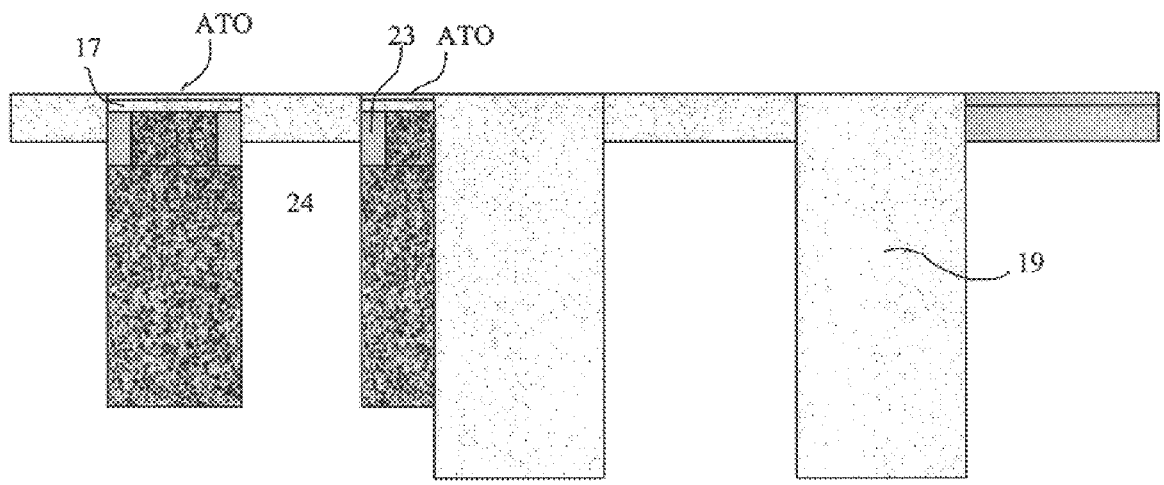
FIG. 9 is the cross-sectional view representing the progression from FIG. 8 in which an array top oxide (ATO) deposition and oxide planarization by CMP is effected.

An array top oxide (ATO) deposition is affected, as can be seen in FIG. 9. The ATO is followed by oxide planarization (CMP) to arrive at the shown structure.

Figure 10:
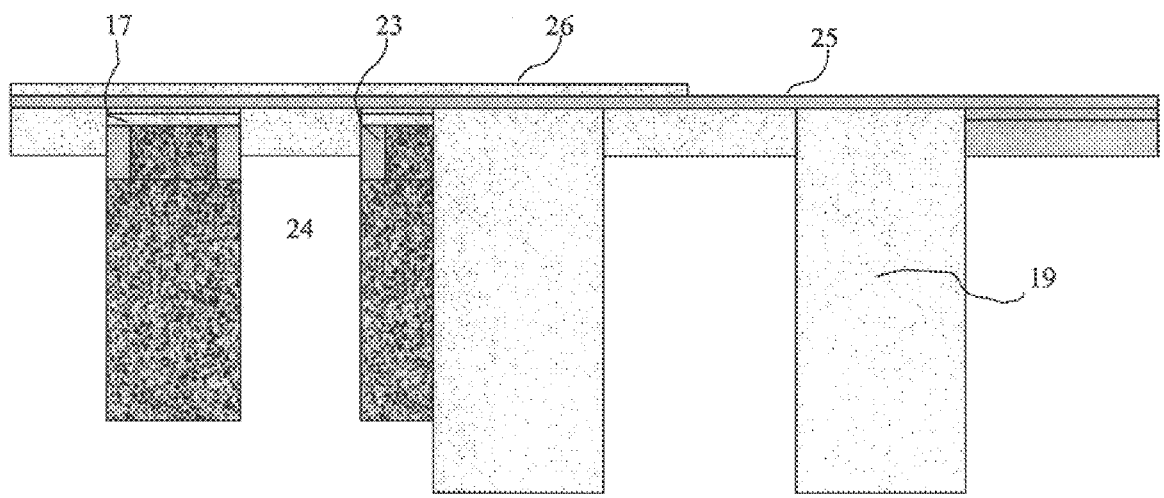
FIG. 10 is a cross-sectional view of the structure from FIG. 9 in which an array cap nitride is affected by LPCVD, and cap oxide is affected on TEOS (Tetraethylorthosilicate) to obtain a silicon oxide, and wherein deposition and cap oxide structuring is formed using lithography and HF oxide etch.

An array cap nitride 25 is deposited by LPCVD to a thickness of about 55 Å and a cap oxide 26 is affected by LPCVD of TEOS oxide to a thickness of about 100 Å, as can be seen in FIG. 10. The deposition and cap oxide structuring (lithography, HF oxide etch) need not be followed by a planarization step).

Figure 11:
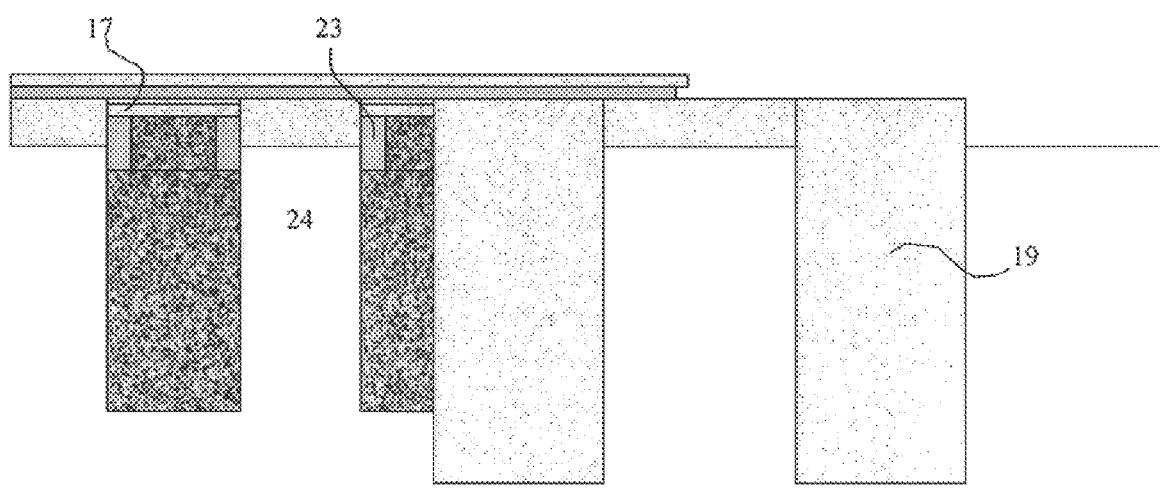
FIG. 11 is a view of the cross sectional structure from FIG. 10 in which a cap nitride is deposited by LPCVD followed by pad nitride stripping in the support area.
Figure 12:
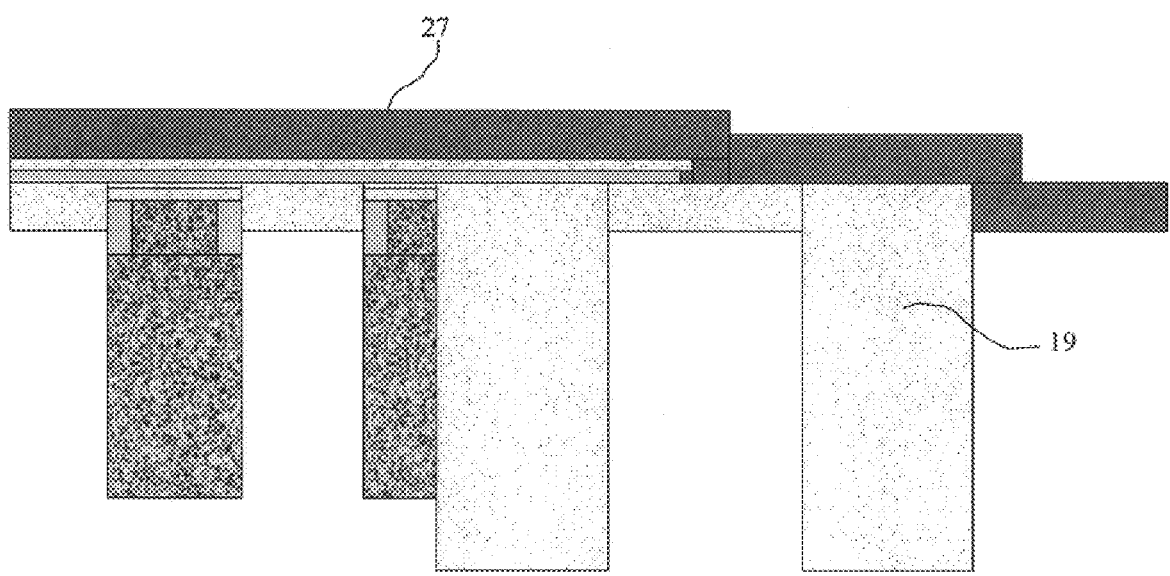
FIG. 12 shows the progression from FIG. 11 in which there is support processing as follows: affecting a pad oxide (oxide underneath of pad nitride, not shown); affecting a strip (HF wet etch); oxidation of screen oxide (by thermal oxidation); affecting support well implants; affecting screen oxide strip (HF wet etch); affecting gate oxidation (by thermal oxidation); and affecting a poly #1 deposition (by LPCVD poly or CVD poly).

Following completion of the structure in FIG. 10, the structure in FIG. 11 is obtained by performing a pad nitride strip in the support area. Support processing produces the structure shown in FIG. 12, and the support processing comprises: affecting a pad oxide (oxide underneath of pad nitride [not shown]) strip (HF wet etch); affecting oxidation of screen oxide by thermal oxidation; supplying support well implantation or implants; affecting screen oxide stripping (HF wet etch); performing a gate oxidation (thermal oxide); and affecting a poly #1 deposition 27 by LPCVD poly or CVD poly.

Figure 13:
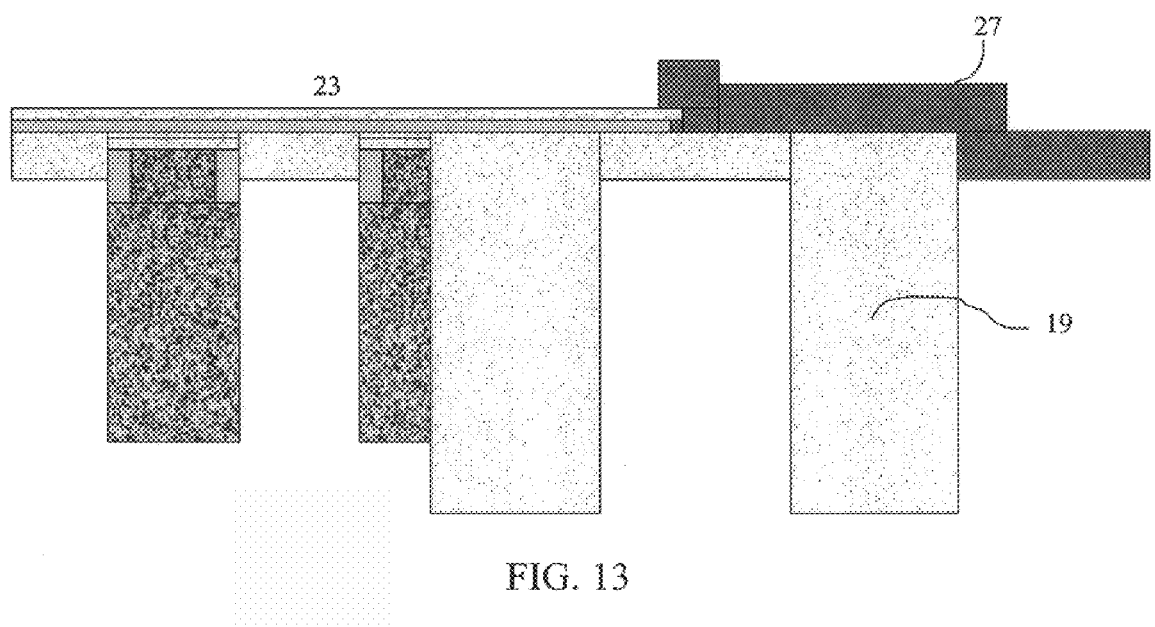
FIG. 13 depicts poly #1 structuring by lithography, and poly RIE selective to oxide.
Figure 14:
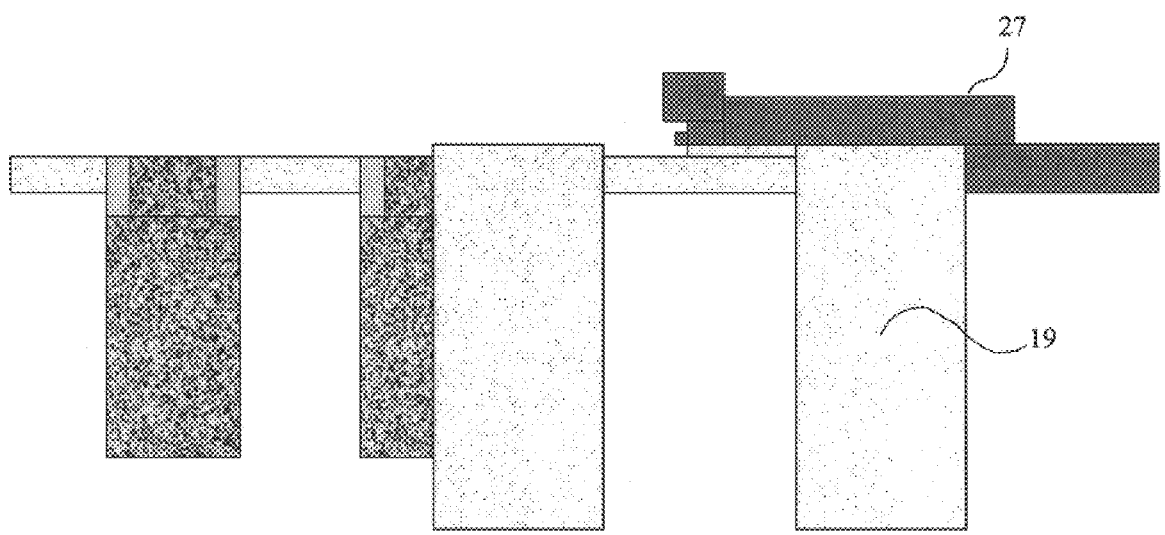
FIG. 14 is a process progression from FIG. 13 in which a array cap oxide etch is performed (HF etch), an array cap nitride etch is performed (hot phosphoric acid) and oxide etch (HF etch to expose the vertical gate poly.

The FIG. 13 poly #1 is structured by affecting structuring using lithography, poly RIE selective to oxide. An array cap oxide etch (HF etch) array cap nitride etch (hot phosphoric acid) and oxide etch (HF etch), is affected to arrive at the structure in FIG. 14 to expose the vertical gate poly 12. A gate conductor poly #2 and WSi deposition (alternatives may be W/WN directly or on poly #2) or only poly #2 deposition followed by a cap nitride deposition (in case of W/Si or W/WN) is utilized to form the structure shown in FIG. 15. Gate conductor poly #2 (29) and WSi deposition 30 are shown in FIG. 15; however, the WSi deposition or a W/WN may be utilized—that is, the W/WN may be used in lieu of WSi material.

Figure 15:
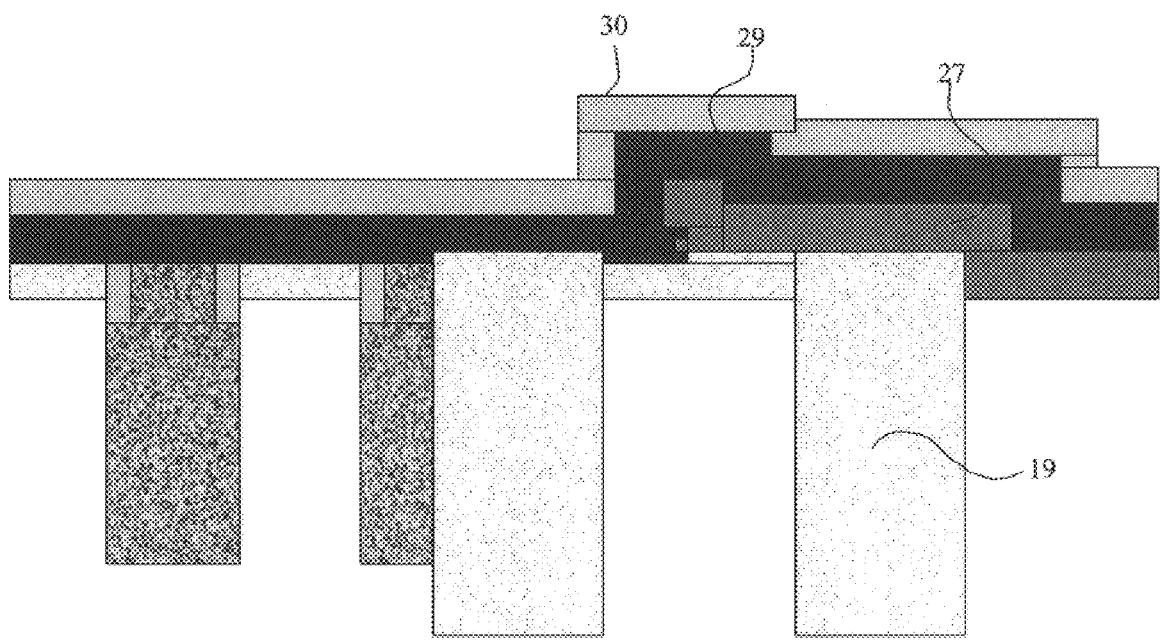
FIG. 15 is a process progression from FIG. 14 in which a gate conductor poly #2 and WSi deposition (alternatives are W/WN directly or on poly #2) or only poly #2 deposition, cap nitride deposition (in the case of WSi or W/WN).
Figure 16:
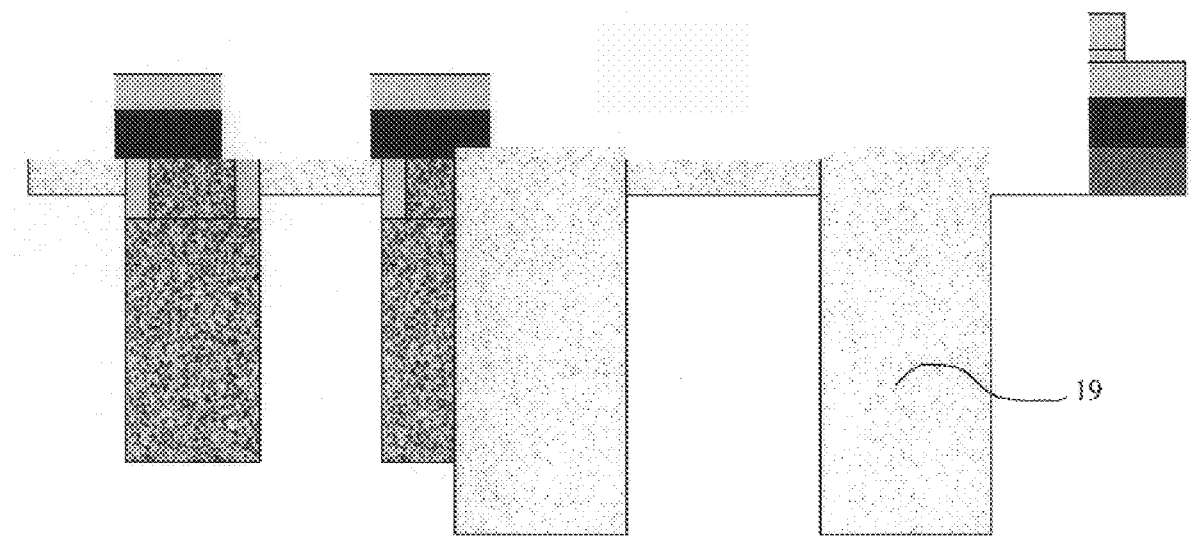
FIG. 16 is a progression from FIG. 15 in which there is gate conductor structuring [lithography, RIE selective to oxide (at the end of the RIE process)], wherein the diagram is drawn assuming misalignment of the gate conductor to the vertical gate poly.

The structure in FIG. 16 is the result of affecting gate conductor structuring on FIG. 15. The gate conductor structuring utilizes lithography, RIE selective to oxide [at the end of the RIE process]). This structure is drawn under the assumption of misalignment of the gate conductor to the vertical gate poly.

Figure 17:
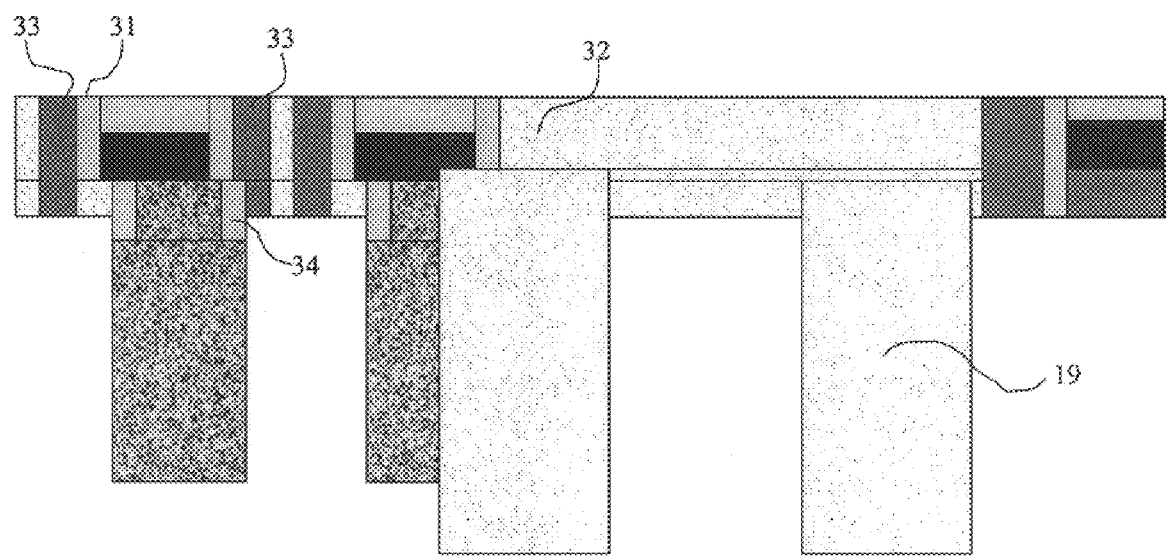
FIG. 17 is a progression from FIG. 16 in which the steps include: gate conductor sidewall oxidation (thermal oxidation, not shown); gate conductor sidewall spacer formation (LPCVD nitride deposition, nitride RIE selective to oxide); source/drain implantation; inter layer dielectric (ILD) oxide deposition (LPCVD) TEOS oxide, BPSG (Boron phosphorous silicate glass) oxide; planarization of ILD oxide and stopping on the cap nitride; contact structuring (lithography, oxide RIE); and contact fill (LPCVD poly, CVD poly or metal).

The concluding structure resulting from the invention process is shown in FIG. 17. The process steps progressing from FIG. 16 to FIG. 17 include: [1]affecting a gate conductor sidewall oxidation (thermal oxide, not shown); forming a gate conductor sidewall spacer formation 31 (LPCVD nitride deposition), nitride RIE selective to oxide); affecting source/drain implantation; affecting an interlayer dielectric (ILD) oxide deposition 32 (LPCVD) TEOS oxide, BPSG [Boron Phosphorus Silicate Glass] oxide; planarization of the ILD oxide, with stopping on the cap nitride; affecting contact structuring (via lithography and oxide RIE); affecting a contact fill 33 (using LPCVD poly, CVD poly or metal). The application of the spacer 34 together with the gate conductor spacer 31 helps to isolate the contacts 33 of the vertical device from the vertical gate poly 12 in case of misalignment. As may be seen from the foregoing, the spacer formation process is improved on a poly stud planarized to pad nitride, by formation of an oxide on top of the poly prior to the pad nitride strip. After pad nitride removal the poly is etched back and nitride is deposited conformal followed by anisotropic nitride RIE etch, so that the oxide protects the nitride underneath from being etched.

[1]LDD (lightly doped drain) or pocket implant can be done here)

We claim:

1. In a method for formation of spacers during preparation of semiconductor integrated circuit devices, the improvement of forming an oxide on top of a poly prior to a nitride strip, on a poly stud planarized to a pad nitride, comprising:
   a) subjecting a semiconductor structure comprising a pad nitride and pad oxide underneath said pad nitride to poly oxidation selective to said pad nitride;
   b) forming a vertical gate cap nitride by deposition;
   c) forming a shallow trench isolation (STI);
   d) depositing a support cover oxide in a support area;
   e) performing a pad nitride strip in an array area;
   f) performing an isotropic poly etch back;
   g) performing a spacer sidewall nitride deposition and spacer etch selective to oxide;
   h) performing an array top oxide (ATO) by deposition and oxide planarization;
   i) performing an array cap nitride and cap oxide deposition, and structuring said cap oxide;
   j) forming a cap nitride and pad nitride strip in the support area processing comprising:
      I) performing a pad oxide strip of oxide underneath said pad nitride;
      II) performing oxidation of a screen oxide;
      III) performing support well implants by masking;
      IV) performing a screen oxide strip;
      V) performing gate oxidation; and
      VI) forming a poly #1 deposition
   k) structuring the poly #1 deposition;
   l) performing an array cap oxide etch, an array cap nitride etch and an oxide etch to expose a vertical gate poly;
   m) performing either a gate conductor poly #2 deposition or a combination of a gate conductor poly #2 deposition and WSi or W/WN deposition followed by a cap nitride deposition;
   n) structuring the gate conductor; and
   o)
      I) performing gate conductor sidewall oxidation;
      II) forming a gate conductor sidewall spacer;
      III) performing source/drain implants by masking;
   p) performing a inter layer dielectric (ILD)oxide deposition; planarization of the ILD oxide and stopping on the cap nitride; contact structuring; and affecting contact fill adjacent the gate conductor sidewall spacer.

2. The method of claim 1 wherein in step a) said poly oxidation is thermal oxidation.

3. The method of claim 1 wherein in step b) said vertical gate cap nitride deposition is performed by LPCVD.

4. The method of claim 3 wherein said vertical gate pad nitride deposition is about 55 Å in thickness.

5. The method of claim 4 wherein in step c) said STI is of a height of about 600 Å.

6. A method of claim 1 wherein in step d) said support cover oxide deposition is by LPCVD of TEOS.

7. The method of claim 6 wherein said support cover oxide deposition is at a thickness of about 100 Å.

8. The method of claim 1 wherein in step e) said pad nitride strip in an array pattern is performed using phosphoric acid.

9. The method of claim 1 wherein in step f) said isotropic poly etch back is a plasma etch selective to oxide.

10. The method of claim 1 wherein in step g) said spacer sidewall nitride deposition is by LPCVD and said spacer etch is by RIE.

11. The method of claim 1 wherein in step h) said planarization is by CMP.

12. The method of claim 1 wherein in step i) said array cap nitride deposition is by LPCVD and said cap oxide deposition is by LPCVD.

13. The method of claim 12 wherein said nitride deposition by LPCVD is about 55 Å; and said cap oxide deposition by LPCVD is accomplished using TEOS to achieve a thickness of about 100 Å.

14. The method of claim 1 wherein in step j) said cap nitride is formed using LPCVD to provide a thickness of about 55 Å.

15. The method of claim 1 wherein in step k) VI, said poly #1 deposition is by CVD.

16. The method of claim 1 wherein in step l) said structuring is accomplished by lithography and RIE selective to oxide.

17. The method of claim 1 wherein in step m) said array cap oxide etch is by HF; said array cap nitride etch is by phosphoric acid; said oxide etch is by HF.

18. The method of claim 1 wherein in step o) said gate conductor structuring is performed by lithography and RIE selective to oxide.

19. The method of claim 1 wherein step p) I) said oxidation is by thermal oxidation; in step p) II) said gate conductor sidewall spacer formation is by LPCVD nitride deposition and nitride RIE is selective to oxide.

20. The method of claim 1 wherein in step q) said ILD deposition is by LPCVD of TEOS or BPSG.

21. The method of claim 1 wherein in step q) said contact fill is CVD poly or metal.

* * * * *